US008188802B2

(12) United States Patent
Garcia

(10) Patent No.: US 8,188,802 B2
(45) Date of Patent: May 29, 2012

(54) SYSTEM AND METHOD FOR EFFICIENTLY GENERATING AN OSCILLATING SIGNAL

(75) Inventor: Jorge A. Garcia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/474,528

(22) Filed: May 29, 2009

(65) Prior Publication Data

US 2010/0289591 A1 Nov. 18, 2010

Related U.S. Application Data

(60) Provisional application No. 61/177,870, filed on May 13, 2009.

(51) Int. Cl.
*H03L 5/00* (2006.01)
*H03B 5/32* (2006.01)

(52) U.S. Cl. ............ 331/185; 331/15; 331/34; 331/158; 331/160; 331/183

(58) Field of Classification Search ..................... 331/15, 331/34, 109, 154, 158, 160, 182, 183, 185, 331/186
See application file for complete search history.

(56) References Cited

U.S. PATENT DOCUMENTS

| | | | |
|---|---|---|---|
| 5,097,228 A | 3/1992 | McJunkin | |
| 5,101,178 A * | 3/1992 | Komoda | ........................ 331/158 |
| 5,175,884 A | 12/1992 | Suarez | |
| 6,172,576 B1 | 1/2001 | Endo et al. | |
| 6,194,973 B1 | 2/2001 | Williamson | |
| 6,798,301 B1 | 9/2004 | Balan et al. | |
| 6,838,951 B1 * | 1/2005 | Nieri et al. | ................. 331/177 V |
| 6,873,212 B2 * | 3/2005 | Rogers | ........................... 330/307 |
| 6,909,336 B1 * | 6/2005 | Rajagopalan et al. | ........ 331/183 |
| 7,062,229 B2 | 6/2006 | Dunworth et al. | |
| 7,227,426 B2 * | 6/2007 | Kaizuka | ........................ 331/186 |
| 7,301,553 B2 * | 11/2007 | Koga et al. | ..................... 347/237 |
| 7,336,134 B1 * | 2/2008 | Janesch et al. | ............. 331/36 C |
| 7,348,861 B1 | 3/2008 | Wu et al. | |
| 7,546,097 B2 | 6/2009 | Dunworth et al. | |
| 7,586,379 B2 * | 9/2009 | Shimizu | ........................ 331/16 |

(Continued)

FOREIGN PATENT DOCUMENTS

| | | |
|---|---|---|
| EP | 0709965 A1 | 5/1996 |
| EP | 1791252 A1 | 5/2007 |
| JP | 2001313527 A | 11/2001 |

OTHER PUBLICATIONS

International Search Report and Written Opinion—PCT/US2010/033675, International Search Authority—European Patent Office—Dec. 21, 2010.

(Continued)

*Primary Examiner* — Levi Gannon
(74) *Attorney, Agent, or Firm* — Dang M. Vo; Paul S. Holdaway

(57) ABSTRACT

An apparatus for generating an oscillating signal including an oscillator configured to generate the oscillating signal, a controller configured to generate a control signal that controls a characteristic (e.g., amplitude or frequency) of the oscillating signal, and a power supply configured to supply power to the oscillator as a function of the control signal. The power supply may be configured to supply power to the oscillator as a function of the amplitude or frequency of the oscillating signal to improve power efficiency.

37 Claims, 8 Drawing Sheets

U.S. PATENT DOCUMENTS

| | | | |
|---|---|---|---|
| 7,592,878 B2 * | 9/2009 | Fagg et al. | 331/186 |
| 7,598,821 B2 * | 10/2009 | Novac | 331/160 |
| 2004/0169564 A1 | 9/2004 | Muramatsu | |
| 2004/0212444 A1 | 10/2004 | Peng | |
| 2005/0104670 A1 | 5/2005 | Naviasky et al. | |
| 2008/0297265 A1 | 12/2008 | Tarng et al. | |

OTHER PUBLICATIONS

Vittoz, Degrauwe, & Bitz, "High-Performance Crystal Oscillator Circuits: Theory and Application", IEEE Journal of Solid-State Circuits, vol. 23, No. 3, Jun. 1988.

* cited by examiner

SYSTEM AND METHOD FOR EFFICIENTLY GENERATING AN OSCILLATING SIGNAL

CROSS-REFERENCE TO RELATED APPLICATION

The application claims priority to Provisional Application, Ser. No. 61/177,870, filed on May 13, 2009, and entitled "System and Method for Efficiently Generating an Oscillating Signal," which is incorporated herein by reference.

FIELD

The present disclosure relates generally to communication systems, and more specifically, to a system and method for efficiently generating an oscillating signal.

BACKGROUND

In many communication systems, an oscillator is employed to generate a reference oscillating signal from which other signals or clocks are produced. For example, the reference oscillating signal may be used to generate one or more clocks for driving digital and analog circuitry. Additionally, the reference oscillating signal may be employed in a local oscillator (LO) for downconverting radio frequency (RF), intermediate frequency (IF), or other signals to lower or baseband frequencies, and/or for upconverting baseband signals to IF, RF, or other higher frequencies.

Many of these communication systems are portable systems, such as cellular telephones, personal digital assistants (PDAs), handheld devices, and other portable communication devices. These portable communication systems typically rely on a limited power source, such as a battery, to perform the various intended operations. A limited power source typically has a continuous use lifetime that depends on the amount of power used by the portable device. It is generally desired to extend the continuous use lifetime as much as possible. Accordingly, portable communication systems are more frequently designed to consume less and less power.

With regard to oscillators, they are typically designed to consume substantially more power necessary to ensure the continuous generation of an oscillation signal. For portable devices, such excess power consumption may significantly impact the continuous use lifetime of the devices. Thus, there is a need for a more power efficient method and apparatus for generating an oscillating signal.

SUMMARY

An aspect of the disclosure relates to an apparatus for generating an oscillating signal. The apparatus comprises an oscillator configured to generate the oscillating signal, a controller configured to generate a control signal that controls a characteristic of the oscillating signal, and a power supply configured to supply power to the oscillator as a function of the control signal. In another aspect, the characteristic of the oscillating signal comprises the frequency or amplitude of the oscillating signal.

In yet another aspect, the apparatus further comprises a detector configured to generate an oscillation detection signal indicative of whether the oscillator is generating the oscillating signal. In still another aspect, the apparatus further comprises an amplifier configured to amplify the oscillating signal.

In another aspect of the disclosure, the power supply is configured to supply power to the oscillator as a function of the amplitude of the oscillating signal. In another aspect, the power supply is configured to supply a substantially minimum power for a given amplitude of the oscillating signal. In yet another aspect, the controller is configured to generate the control signal such that the power supply supplies substantially a minimum power to the oscillator for generating the oscillating signal cycling within a defined frequency range. Additionally, in another aspect, the controller is configured to generate the control signal to set a default capacitance of a variable capacitor in the oscillator upon start up to achieve substantially a minimum power for the oscillator to generate the oscillating signal.

In still another aspect, the controller is configured to generate the control signal so that the oscillator generates the oscillating signal cycling with a defined frequency. In another aspect, the controller is configured to generate the control signal so that the oscillator generates the oscillating signal cycling with a defined frequency in response to changes in temperature or aging of the oscillator. In another aspect, the power supply comprises a low pass filter (LPF) configured to filter the oscillating signal, and a current mirror configured to generate a current for the oscillator based on the filtered oscillating signal.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1A:
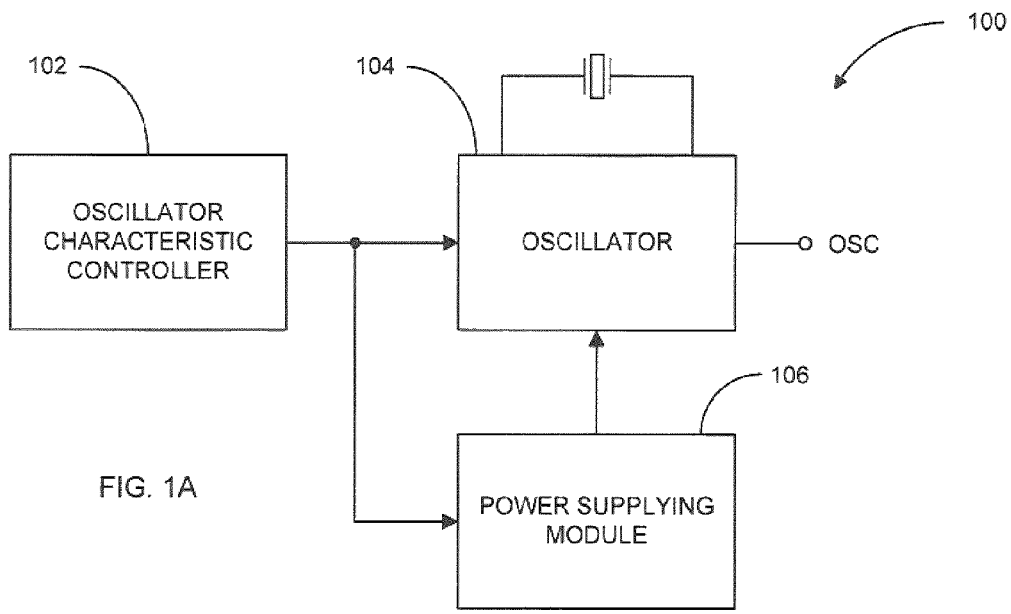
FIG. 1A illustrates a block diagram of an exemplary apparatus for generating an oscillating signal in accordance with an aspect of the disclosure.

FIG. 1A illustrates a block diagram of an exemplary apparatus 100 for generating an oscillating signal in accordance with an aspect of the disclosure. In summary, the apparatus 100 may be configured to generate an oscillating signal in a power efficient manner. As discussed in more detail below, the apparatus 100 includes a power supplying module for supplying power to an oscillator based on a characteristic of the oscillating signal. If, for example, the characteristic of the oscillating signal is its amplitude, the power supplying module may be configured to supply substantially the minimum power to the oscillator for a given amplitude of the oscillating signal.

In particular, the apparatus 100 comprises a controller 102, an oscillator 104 including a crystal (Xtal), and a power supplying module 106. The oscillator 104 is configured to generate an oscillating signal. The controller 102 is configured to generate a control signal that controls a characteristic of the oscillating signal generated by the oscillator 104. As an example, the controlled characteristic of the oscillating signal may include the amplitude and/or frequency of the oscillating signal. The power supplying module 106 is configured to supply power to the oscillator 104 as a function of the control signal generated by the controller 102.

As mentioned above, the apparatus 100 may be configured to generate an oscillating signal in a power efficient manner. For example, the power supplying module 106 may be configured to supply substantially the minimum power to the oscillator 104 for a given amplitude of the oscillating signal as dictated by the control signal generated by the controller 102. Additionally, the power supplying module 106 may be configured to supply substantially the minimum power to the oscillator 104 for a given frequency of the oscillating signal as dictated by the control signal generated by the controller 102. Thus, as discussed in more detail below, the power supplying module 106 is configured to adjust the power supplied to the oscillator 104 in response to varying amplitude and frequency of the oscillating signal so that the oscillator is operated in a power efficient manner.

Figure 1B:
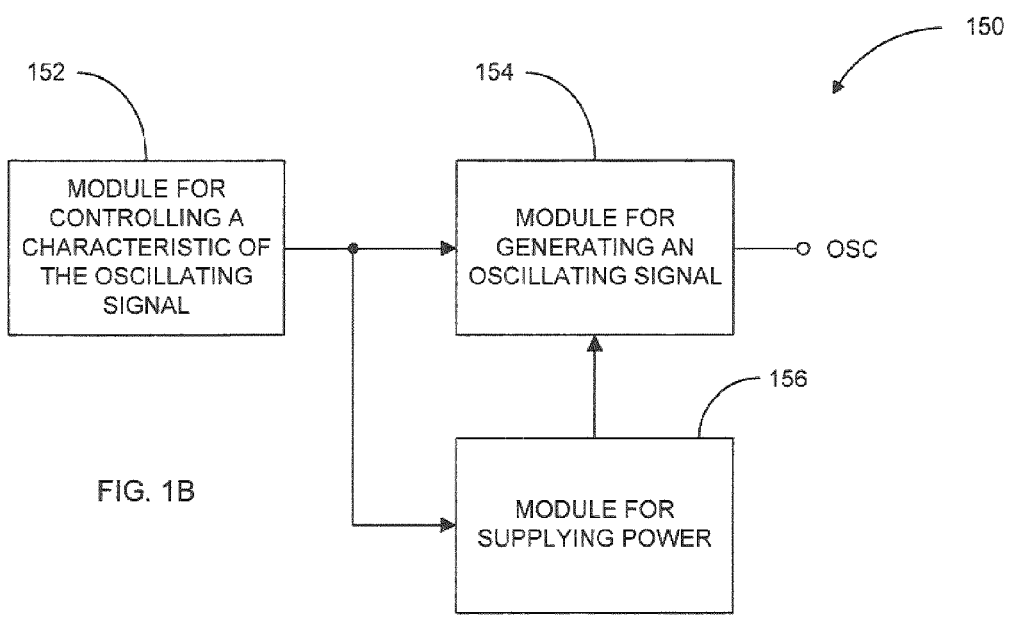
FIG. 1B illustrates a block diagram of another exemplary apparatus for generating an oscillating signal in accordance with another aspect of the disclosure.

FIG. 1B illustrates a block diagram of another exemplary apparatus 150 for generating an oscillating signal in accordance with another aspect of the disclosure. In general, the apparatus 150 comprises a module 154 for generating an oscillating signal, a module 152 for controlling a characteristic (e.g., amplitude and/or frequency) of the oscillating signal via a control signal, and a module 156 for supplying power to the oscillating signal generating module 154 based on the control signal generated by the controlling module 152.

Figure 2:
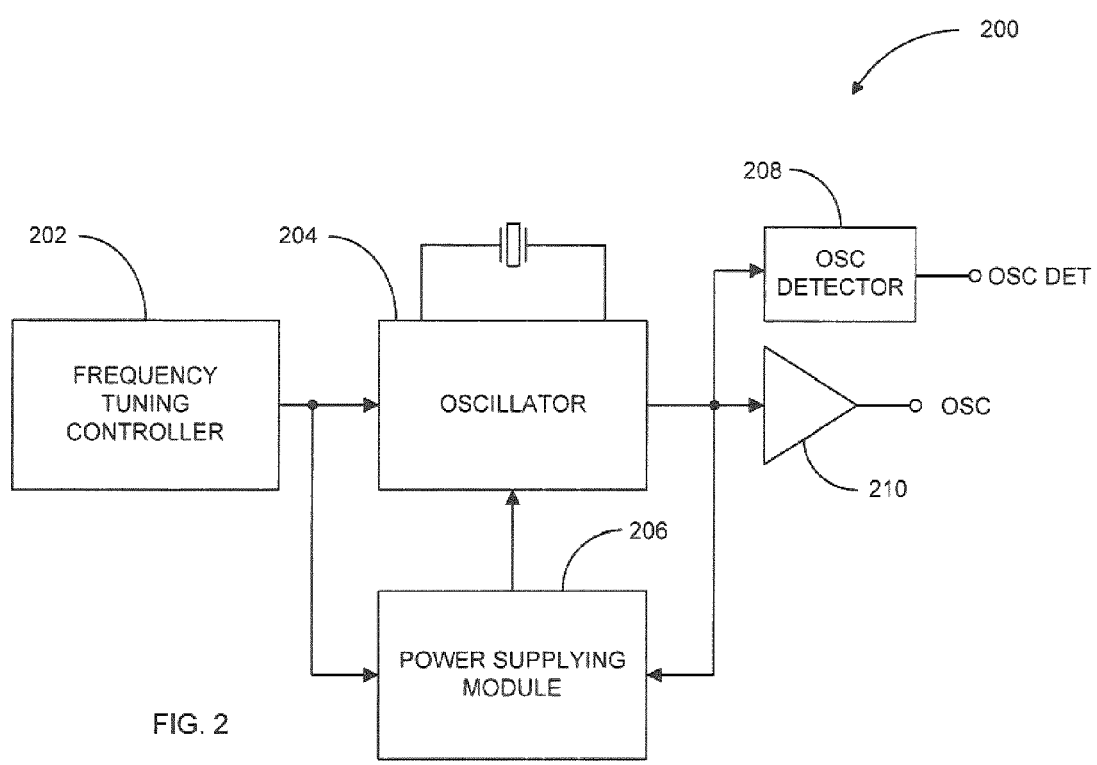
FIG. 2 illustrates a block diagram of another exemplary apparatus for generating an oscillating signal in accordance with another aspect of the disclosure.

FIG. 2 illustrates a block diagram of another exemplary apparatus 200 for generating an oscillating signal in accordance with another aspect of the disclosure. Similar to apparatus 100, the apparatus 200 may be configured to generate an oscillating signal in a power efficient manner. In this particular example, a power supplying module is configured to adjust the power supplied to an oscillator in response to a frequency control signal generated by a frequency tuning controller. This is done in order to operate the oscillator in a power efficient manner in response to the tuning of the frequency of the oscillating signal.

In particular, the apparatus 200 comprises a frequency tuning controller 202, an oscillator 204 including a Xtal, a power supplying module 206, an oscillation detector 208, and an amplifier 210. The oscillator 204 is configured to generate an oscillating signal. The frequency tuning controller 202 is configured to generate a frequency control signal that controls the frequency of the oscillating signal generated by the oscillator 204. The power supplying module 206 is configured to supply power to the oscillator 204 as a function of the control signal generated by the controller 202. The oscillation detector 208 is configured to generate a signal indicative of whether the oscillator 204 is generating the oscillating signal. The amplifier 210 is configured to amplify the oscillating signal generated by the oscillator 204.

Similar to the apparatus 100, the apparatus 200 may be configured to generate an oscillating signal in a power efficient manner. For example, the power supplying module 206 may be configured to supply substantially the minimum power to the oscillator 204 for a given frequency of the oscillating signal as dictated by the control signal generated by the frequency tuning controller 202. Thus, as discussed in more detail below, the power supplying module 206 is configured to adjust the power supplied to the oscillator 204 in response to frequency tuning of the oscillating signal so that the oscillator is operated in a power efficient manner.

Figure 3:
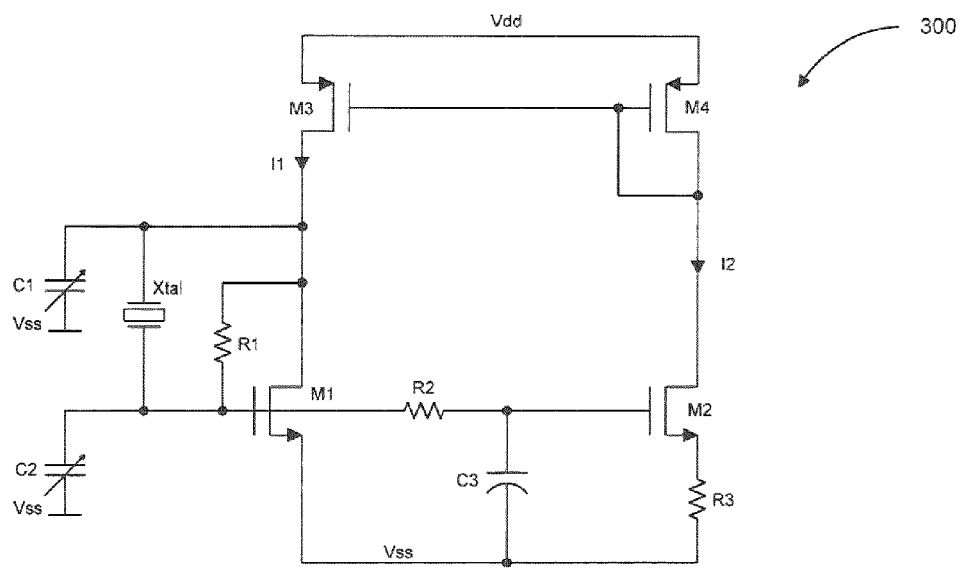
FIG. 3 illustrates a schematic diagram of another exemplary apparatus for generating an oscillating signal in accordance with another aspect of the disclosure.

FIG. 3 illustrates a schematic diagram of another exemplary apparatus 300 for generating an oscillating signal in accordance with another aspect of the disclosure. The exemplary apparatus 300 may be a detailed implementation of at least a portion of the apparatuses 100 and 200 previously discussed. As discussed in more detail below, the apparatus 300 includes a feedback network that controls the current supplied to the oscillator active device inversely with the amplitude of the oscillating signal. In this way, the active device settles on a bias setting that ensures substantially the minimum current supplied to the active device for a given amplitude of the oscillating signal.

In particular, the apparatus 300 comprises n-channel metal oxide semiconductor field effect transistors (MOSFETs) M1 and M2, p-channel MOSFETs M3 and M4, resistors R1, R2, and R3, capacitors C1, C2, and C3, and crystal (Xtal). The sources of MOSFETs M3 and M4 are electrically coupled to a positive power supply rail Vdd, the gates of MOSFETs M3 and M4 are electrically coupled to the drain of MOSFET M2, and the drain of MOSFET M3 is electrically coupled to the drain of MOSFET M1. The resistor R1 and the Xtal are electrically coupled respectively between the drain and gate of MOSFET M1. The capacitor C1 is electrically coupled between the drain of MOSFET M1 and a negative power supply rail Vss. The capacitor C2 is electrically coupled between the gate of MOSFET M1 and the negative power supply rail Vss. The source of MOSFET M1 is electrically coupled to the negative power supply rail Vss. The resistor R2 is electrically coupled between the gate of MOSFET M1 and the gate of MOSFET M2. The capacitor C3 is electrically coupled between the gate of MOSFET M2 and the negative power supply rail Vss. The resistor R3 is electrically coupled between the source of MOSFET M2 and the negative power supply rail Vss.

A principle upon which the apparatus 300 operates is that if the current I1 through MOSFET M1 is substantially fixed, the voltage at the gate of MOSFET M1 varies inversely with the amplitude of the oscillating signal at the gate of MOSFET M1. The resistor R2 and capacitor C3 operate as a low pass filter (LPF) to filter the gate voltage of MOSFET M1, and provides the filtered voltage to the gate of MOSFET M2. The MOSFET M2 then generates a current I2 related to the filtered voltage. The MOSFETs M3 and M4 operate as a current mirror to mirror the current I2 to the current I1.

Thus, the current I1 is inversely related to the amplitude of the oscillating signal at the gate of MOSFET M1. Accordingly, as the amplitude of the oscillating signal increases, the current I1 through MOSFET M1 decreases. Conversely, as the amplitude of the oscillating signal decreases, the current I1 through MOSFET M1 increases. The current I1 and amplitude of the oscillating signal will reach an equilibrium state, where the current I1 is substantially minimized for a given amplitude of the oscillating signal. In other words, the apparatus 300 draws substantially the minimum power for a given amplitude of the oscillating signal. Additionally, as the capacitors C1 and C2 are changed in order to tune the frequency of the oscillating signal, the feedback network (e.g., R2, C3, M2, M4, and M3) will readjust the bias of the MOSFET M1 so that it substantially draws the minimum current or power for a given amplitude of the oscillating signal. This makes the apparatus 300 very power efficient.

The resistor R1 and Xtal provide another feedback network for the active device M1 in order to initiate and generate the oscillating signal. As previously discussed, the variable capacitors, often referred to in the relevant art as the Pierce capacitors, allow for external tuning or adjustment of the frequency of the oscillating signal. It shall be understood that one of the capacitors C1 and C2 may be eliminated, as a single variable capacitor is sufficient to tune the oscillator. However, a more symmetrical approach as shown may be preferred. As discussed in more detail below, additional elements may be added to the apparatus to provide additional features and operations.

Figure 4:
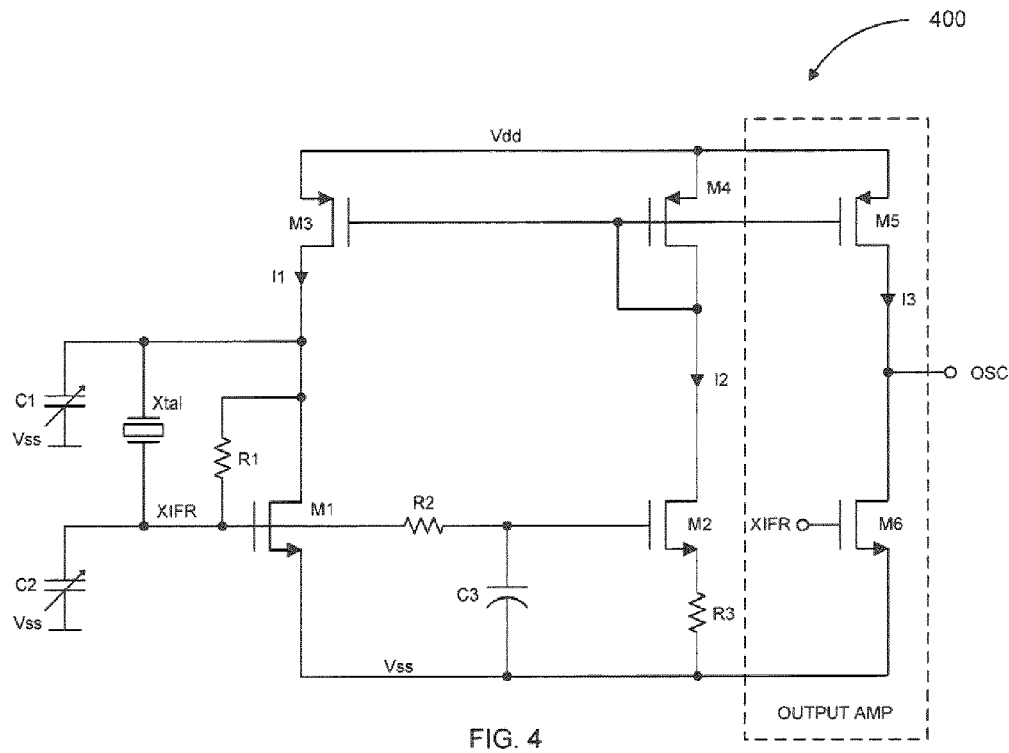
FIG. 4 illustrates a schematic diagram of another exemplary apparatus for generating an oscillating signal in accordance with another aspect of the disclosure.

FIG. 4 illustrates a schematic diagram of another exemplary apparatus 400 for generating an oscillating signal in accordance with another aspect of the disclosure. The apparatus 400 is similar to the previously-discussed apparatus 300, except that it includes an output amplifier configured to amplify the oscillating signal. Components that are similar or substantially the same in apparatus 300 are identified with the same reference number in apparatus 400. Thus, the detailed discussion of such components has already been provided above.

Additionally, the apparatus 400 comprises an output amplifier including p-channel MOSFET M5 and n-channel MOSFET M6. The source of MOSFET M5 is electrically coupled to the positive power supply rail Vdd, the gate of MOSFET M5 is electrically coupled to the gates of MOSFETs M3 and M4, and the drain of MOSFET M5 is electrically coupled to the drain of MOSFET M6, and functions also to produce the amplified oscillating signal. The gate of MOSFET M6 is electrically coupled to the gate of MOSFET M1 to receive its gate voltage XIFR. The source of MOSFET M6 is electrically coupled to the negative power supply rail Vss.

In operation, the current I2 through MOSFET M4 is mirrored to the current I3 through MOSFET M5 due to the current mirror configuration of the transistors. The MOSFET M5 may be sized with respect to the size of MOSFET M4 in order to produce a current I3 that is greater than current I2 by, for example, an integer factor (e.g., 2×, 4×, etc.). The oscillating signal is applied to the gate of MOSFET M6 due to its gate being electrically coupled to the gate of MOSFET M1. The MOSFET M6 then generates the amplified oscillating signal at its drain. In this configuration, the amplitude of the oscillating signal is near rail-to-rail (e.g., Vdd-Vss).

Figure 5:
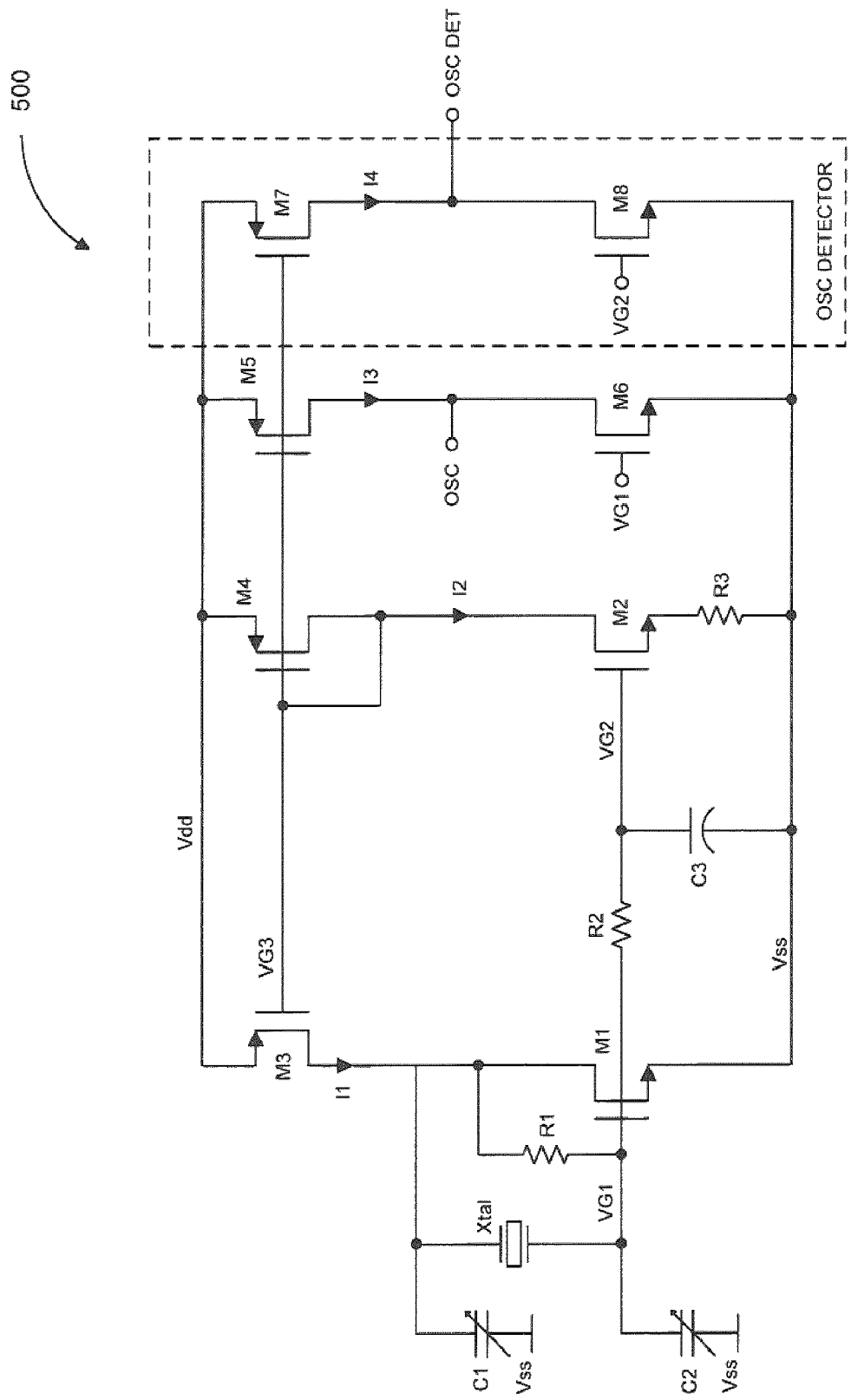
FIG. 5 illustrates a schematic diagram of another exemplary apparatus for generating an oscillating signal in accordance with another aspect of the disclosure.

FIG. 5 illustrates a schematic diagram of another exemplary apparatus 500 for generating an oscillating signal in accordance with another aspect of the disclosure. The apparatus 500 is similar to the previously-discussed apparatus 400, except that it includes an oscillation detector configured to generate a signal indicative of whether an oscillating signal is being generated. Components that are similar or substantially the same in apparatus 400 are identified with the same reference number in apparatus 500. Thus, the detailed discussion of such components has already been provided above.

Additionally, the apparatus 500 comprises an oscillation detector including p-channel MOSFET M7 and n-channel MOSFET M8. The source of MOSFET M7 is electrically coupled to the positive power supply rail Vdd, the gate of MOSFET M7 is electrically coupled to the gates of MOSFETs M3, M4 and M5, and the drain of MOSFET M7 is electrically coupled to the drain of MOSFET M8, and functions also to produce the signal indicative of whether the oscillating signal is being generated. The gate of MOSFET M8 is electrically coupled to the gate of MOSFET M2 to receive its gate voltage VG2. The source of MOSFET M8 is electrically coupled to the negative power supply rail Vss.

In operation, the current I2 through MOSFET M4 is mirrored to the current I4 through MOSFET M7 due to the current mirror configuration of the transistors. As previously discussed, the gate voltage VG2 decreases when the amplitude of the oscillation signal increases. Accordingly, when the oscillating signal is being generated, the relatively low voltage VG2 causes the MOSFET M8 to conduct less; thereby generating a relatively high voltage at the oscillation detection output (OSC DET) to indicate that the oscillation signal is being generated. Conversely, when the oscillating signal is not being generated, the relatively high voltage VG2 causes the MOSFET M8 to conduct more; thereby generating a relatively low voltage at the oscillation detection output (OSC DET) to indicate that the oscillation signal is not being generated.

Figure 6A:
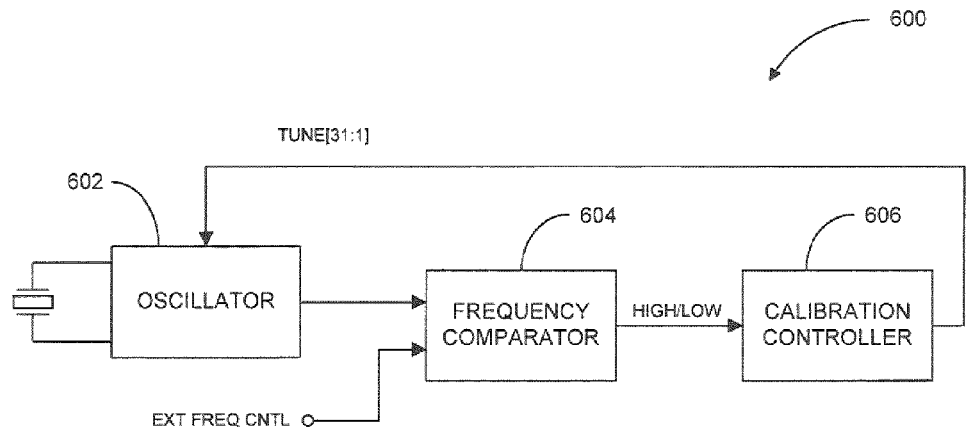
FIG. 6A illustrates a schematic diagram of another exemplary apparatus for generating an oscillating signal in accordance with another aspect of the disclosure.

FIG. 6A illustrates a schematic diagram of another exemplary apparatus 600 for generating an oscillating signal in accordance with another aspect of the disclosure. The apparatus 600 comprises an oscillator 602 including a crystal (Xtal), a frequency comparator 604, and a calibration controller 606. The oscillator 602 including the Xtal may be configured as any of the apparatuses previously discussed. The frequency comparator 604 includes a first input coupled to the output of the oscillator 602, and a second input to receive an external frequency control signal. The external frequency control signal may specify the frequency to which the oscillator 602 is to be tuned. In response, the frequency comparator 604 generates a high or low signal depending on whether the frequency of the oscillating signal is above or below the specified frequency as dictated by the external frequency control signal. The calibration controller 606 generates a frequency tuning word TUNE[31:1] based on the signal generated by the frequency comparator 604.

Figure 6B:
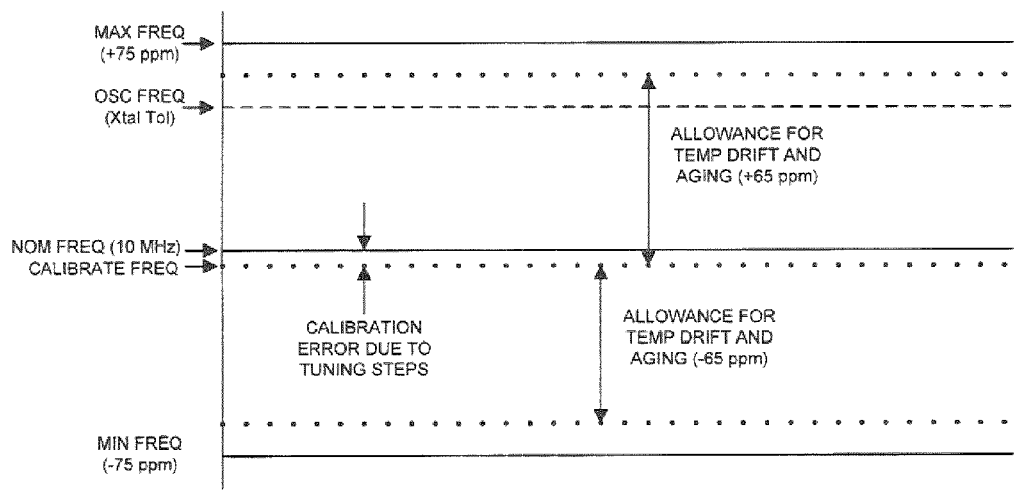
FIG. 6B illustrates a diagram depicting an exemplary controlled frequency variation of an oscillating signal in accordance with another aspect of the disclosure.

FIG. 6B illustrates a graph depicting an exemplary controlled frequency variation of an oscillating signal in accordance with another aspect of the disclosure. The y- or vertical-axis represents frequency. In this example, the apparatus 600 may be specified to generate an oscillating signal having a nominal value at substantially 10 MHz, as indicated by the solid horizontal line in the middle of the graph. The Xtal is typically selected so that its unloaded resonance frequency is slightly above the nominal frequency of 10 MHz. Thus, upon the initial calibration of the apparatus 600, the frequency comparator 604 detects that the frequency of the oscillation signal is greater than 10 MHz, and generates a HIGH signal indicating such. In response, the calibration controller 606 monotonically changes the frequency tuning word TUNE[31:1], and stops when the frequency of the oscillation signal initially crosses below the nominal value. This ensures that the tuned frequency is within one (1) tuning step away from the nominal value, as indicated by the dotted line just below the solid line associated with the nominal frequency value. During use operation, the frequency of the oscillation signal may be allowed to drift (e.g., ±65 parts per million (ppm)) due to environment temperature variation and aging. Beyond that, the frequency could be retuned by the calibration controller 606.

Figures 7A, 7B:
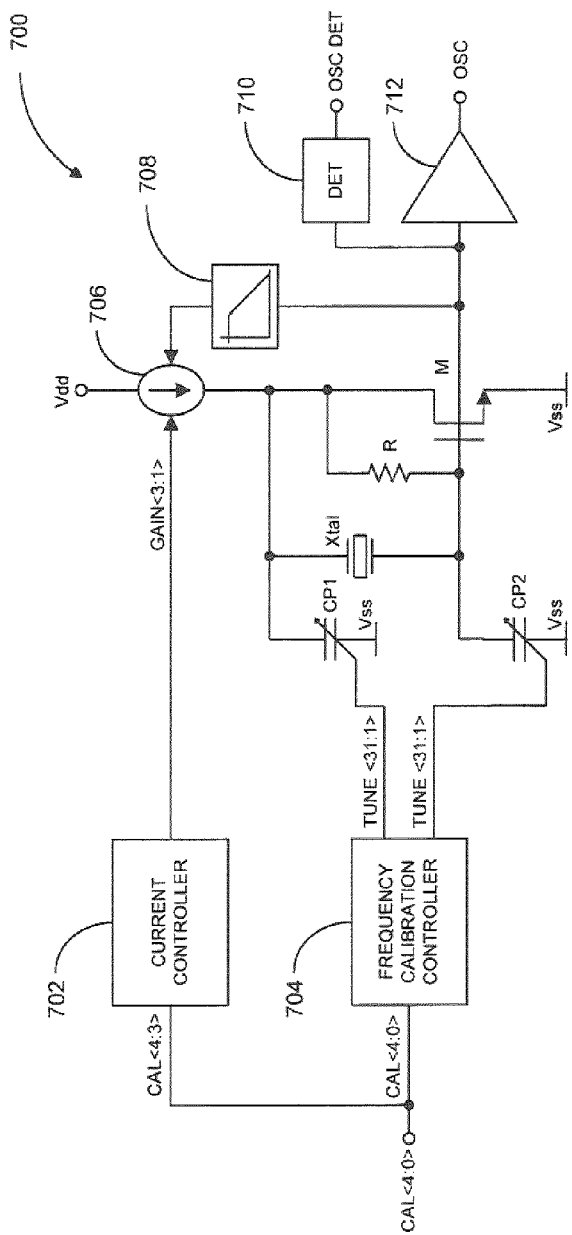
FIG. 7A illustrates a block/schematic diagram of another exemplary apparatus for generating an oscillating signal in accordance with another aspect of the disclosure.
FIG. 7B illustrates a table of exemplary settings for controlling the current supplied to an oscillator in accordance with another aspect of the disclosure.

FIG. 7A illustrates a block/schematic diagram of another exemplary apparatus 700 for generating an oscillating signal in accordance with another aspect of the disclosure. In the previous apparatuses, the wide variation of the Pierce capacitance given by the tuning circuitry typically imposes gain constraints to the oscillator. For instance, the bias current for the oscillator active device required to start the oscillator at the highest Pierce capacitance (e.g., corresponding to the start up frequency) may not be adequate for the case of the smallest Pierce capacitance. Thus, the current supplied to the active device may need to change with the tuning of the Pierce capacitors in order to operate the oscillator in a power efficient manner.

In this regard, the apparatus 700 comprises a current controller 702, a frequency calibration controller 704, variable Pierce capacitors CP1 and CP2, a Xtal, a resistor R, an active device (e.g., MOSFET) M, a current mirror 706, a filter 708, an oscillation detector 710, and an amplifier 712. The Xtal and resistor R are coupled to the active device in a feedback manner in order to generate an oscillation signal. The variable Pierce capacitors CP1 and CP2 are coupled to the Xtal in order to tune the frequency of the oscillation signal. The filter 708 and current mirror 706 provide a feedback control of the current supplied to the active device M in order to ensure substantially a minimum current for a given amplitude of the oscillation signal as previously discussed. Also, as previously discussed, the oscillation detector 710 generates a signal indicative of whether the oscillation signal is being generated. The amplifier 712 amplifies the oscillation signal.

As previously discussed, to operate the apparatus in a more power efficient manner, the gain of the current source 706 (e.g., current mirror) should be changed with the frequency tuning of the Pierce capacitors CP1 and CP2. Accordingly, a frequency control input CAL<4:0> is applied to the frequency calibration controller 704, and the two most significant bits (MSBs), CAL<4:3>, is applied to the current controller 702. In accordance with the frequency control input CAL<4:0>, the frequency calibration controller 704 generates a frequency tuning word TUNE<31:1> for each of the Pierce capacitors CP1 and CP2 in order to tune the frequency of the oscillation signal. In accordance with the two (2) MSBs of the frequency control input CAL<4:3>, the current controller 702 generates a gain control signal GAIN <3:1> to control the current gain of the current mirror 706.

FIG. 7B illustrates a table of exemplary settings for controlling the current supplied to an oscillator in accordance with another aspect of the disclosure. As an example, when the frequency control input CAL<4:0> is between values 0 and 7, the two MSBs CAL<4:3> are 00. In response, the current controller 702 generates a current gain signal GAIN<3:1> of 000, which produces a current gain of 16 for the current mirror 706. When the frequency control input CAL<4:0> is between values 16 and 24, the two MSBs CAL<4:3> are 10. In response, the current controller 702 generates a current gain signal GAIN<3:1> of 110, which produces a current gain of 24 for the current mirror 706. The table tabulates the exemplary settings that maps the frequency control input CAL<4:0> to the gain control signal GAIN<3:1> and the resulting current gain for the current mirror for improved power efficiency.

Figure 8:
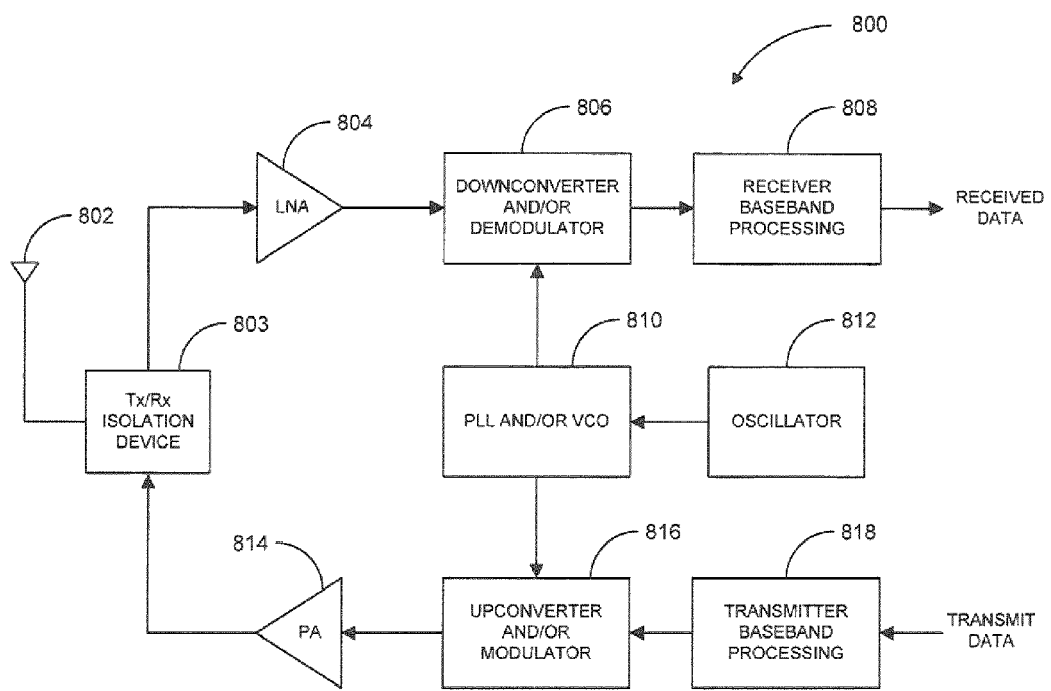
FIG. 8 illustrates a block diagram of an exemplary communication system in accordance with another aspect of the disclosure.

FIG. 8 illustrates a block diagram of an exemplary communication device 800 in accordance with another aspect of the disclosure. The communication device 800 may be one exemplary implementation of a communication device that uses any of the apparatuses previously discussed as a reference oscillator. In particular, the communications device 800 comprises an antenna 802, a Tx/Rx isolation device 803, a low noise amplifier (LNA) 804, a downconverter and/or demodulator 806, a receiver baseband processing module 808, a phase locked loop (PLL) and/or voltage controlled oscillator (VCO) 810, a reference oscillator 812, a transmitter baseband processing module 818, an upconverter and/or modulator 816, and a power amplifier (PA) 814.

As a source communication device, data to be transmitted to a destination communication device is sent to the transmitter baseband processing module 818. The transmitter baseband processing module 818 processes the transmit data to generate an outgoing baseband signal. The upconverter and/or modulator 816, using a local oscillator or signal generated by the PLL and/or VCO 810 with the use of the reference oscillator 812, processes the outgoing baseband signal to generate an RF signal. The PA 814 amplifies the RF signal and provides it to the antenna 802 via the Tx/Rx isolation device 803 for transmission into a wireless medium. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, etc. It shall be understood that the reference oscillator 812 may be used in other types of application, such as a clock source to drive digital and/or analog circuitry.

As a destination communication device, an RF signal carrying data is picked up by the antenna 802 and applied to the LNA 804 via the Tx/Rx isolation device 803. The LNA 804 amplifies the received RF signal. The downconverter and/or demodulator 806, using a local oscillator or signal generated by the PLL and/or VCO 810 with the use of the reference oscillator 812, processes the received RF signal to generate incoming baseband signal. The receiver baseband processing 808 processes the incoming baseband signal to generate the received data. A data processor (not shown) may then perform one or more defined operations based on the received data. For example, the data processor may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Figure 9A:
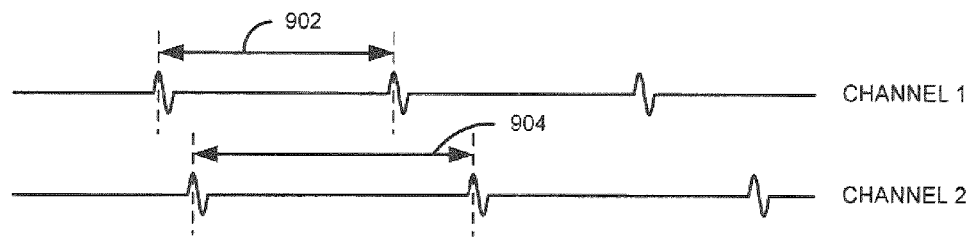
FIGS. 9A-D illustrate timing diagrams of various pulse modulation techniques in accordance with another aspect of the disclosure.

FIG. 9A illustrates different channels (channels 1 and 2) defined with different pulse repetition frequencies (PRF) as an example of a pulse modulation that may be employed in any of the communications systems, devices, and apparatuses described herein. Specifically, pulses for channel 1 have a pulse repetition frequency (PRF) corresponding to a pulse-to-pulse delay period 902. Conversely, pulses for channel 2 have a pulse repetition frequency (PRF) corresponding to a pulse-to-pulse delay period 904. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF)). Conversely, a channel supporting relatively high data rates (e.g., on the order of a several megabits per second or Mbps) may employ a correspondingly higher pulse repetition frequency (PRF).

Figure 9B:
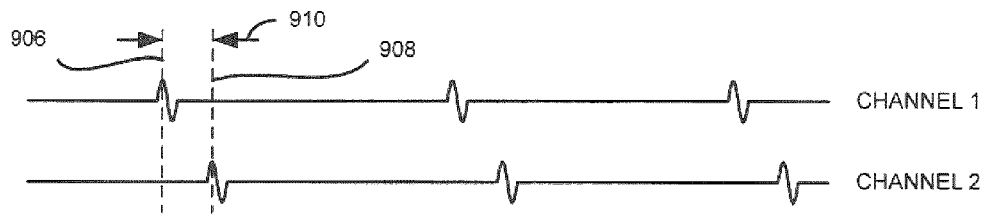

FIG. 9B illustrates different channels (channels 1 and 2) defined with different pulse positions or offsets as an example of a modulation that may be employed in any of the communications systems described herein. Pulses for channel 1 are generated at a point in time as represented by line 906 in accordance with a first pulse offset (e.g., with respect to a given point in time, not shown). Conversely, pulses for channel 2 are generated at a point in time as represented by line 908 in accordance with a second pulse offset. Given the pulse offset difference between the pulses (as represented by the arrows 910), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 9C:
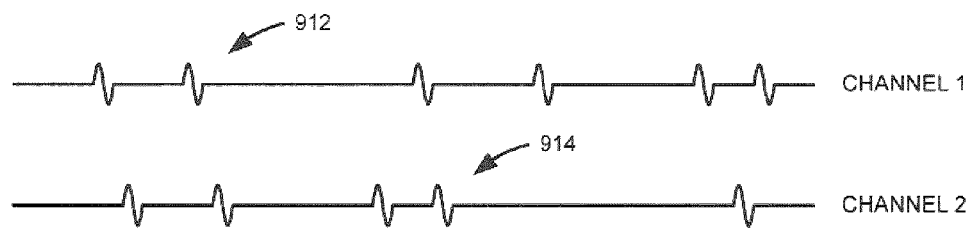

FIG. 9C illustrates different channels (channels 1 and 2) defined with different timing hopping sequences modulation that may be employed in any of the communications systems described herein. For example, pulses 912 for channel 1 may be generated at times in accordance with one time hopping sequence while pulses 914 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 9D:
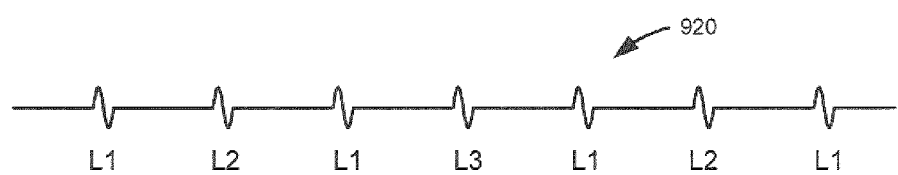

FIG. 9D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 10:
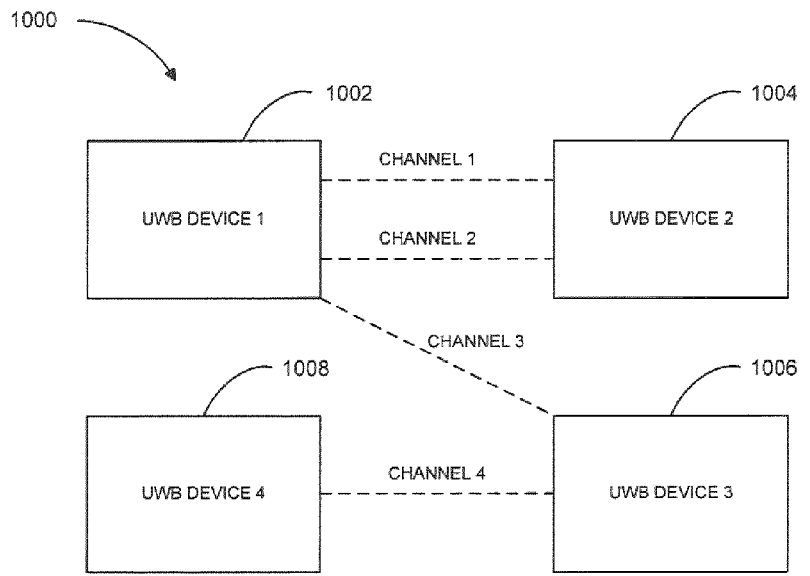
FIG. 10 illustrates a block diagram of various communications devices communicating with each other via various channels in accordance with another aspect of the disclosure.

FIG. 10 illustrates a block diagram of various ultra-wide band (UWB) communications devices communicating with each other via various channels in accordance with another aspect of the disclosure. For example, UWB device 1 1002 is communicating with UWB device 2 1004 via two concurrent UWB channels 1 and 2. UWB device 1002 is communicating with UWB device 3 1006 via a single channel 3. And, UWB device 3 1006 is, in turn, communicating with UWB device 4 1008 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices. A medical device may include smart band-aid, sensors, vital sign monitors, and others. The communications devices described herein may be used in any type of sensing application, such as for sensing automotive, athletic, and physiological (medical) responses.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for generating an oscillating signal, comprising:
    an oscillator configured to generate the oscillating signal;
    a controller configured to generate a control signal that controls a characteristic of the oscillating signal, wherein the control signal comprises a digital word; and
    a power supply configured to supply power to the oscillator in a manner that the supplied power varies inversely with a low pass filtered voltage based on an amplitude of the oscillating signal, wherein the power supplied to the oscillator is based on a sub-word consisting only of a portion of the digital word.

2. The apparatus of claim 1, wherein the characteristic of the oscillating signal comprises a frequency or the amplitude of the oscillating signal.

3. The apparatus of claim 1, further comprising a detector configured to generate an oscillation detection signal indicative of whether the oscillator is generating the oscillating signal.

4. The apparatus of claim 1, further comprising an amplifier configured to amplify the oscillating signal.

5. The apparatus of claim 1, wherein the power supply is configured to supply a substantially minimum power for a given amplitude of the oscillating signal.

6. The apparatus of claim 1, wherein the controller is configured to generate the control signal such that the power supply supplies substantially a minimum power to the oscillator for generating the oscillating signal cycling within a defined frequency range.

7. The apparatus of claim 1, wherein the controller is configured to generate the control signal to set a default capacitance of a variable capacitor in the oscillator upon start up to achieve substantially a minimum power for the oscillator to generate the oscillating signal.

8. The apparatus of claim 1, wherein the controller is configured to generate the control signal so that the oscillator generates the oscillating signal cycling with a defined frequency.

9. The apparatus of claim 1, wherein the controller is configured to generate the control signal so that the oscillator generates the oscillating signal cycling with a defined frequency in response to changes in temperature or aging of the oscillator.

10. The apparatus of claim 1, wherein the power supply comprises:
    a low pass filter (LPF) configured to filter the oscillating signal to produce the low pass filtered voltage; and
    a current mirror configured to generate a current for the oscillator based on the low pass filtered voltage.

11. The apparatus of claim 1, wherein the sub-word consists of only one or more most significant bits of the digital word.

12. A method for generating an oscillating signal, comprising:
    generating the oscillating signal;
    generating a control signal that controls a characteristic of the oscillating signal, wherein the control signal comprises a digital word; and
    supplying power to produce the generating of the oscillating signal in a manner that the supplied power varies inversely with a low pass filtered voltage based on an amplitude of the oscillating signal, wherein the supplied power is based on a sub-word consisting only of a portion of the digital word.

13. The method of claim 12, wherein the characteristic of the oscillating signal comprises a frequency or the amplitude of the oscillating signal.

14. The method of claim 12, further comprising generating an oscillation detection signal indicative of whether the oscillating signal is being generated.

15. The method of claim 12, further comprising amplifying the oscillating signal.

16. The method of claim 12, wherein supplying power comprises supplying a substantially minimum power for a given amplitude of the oscillating signal.

17. The method of claim 12, wherein generating the control signal comprises generating the control signal such that substantially a minimum power is supplied for generating the oscillating signal cycling within a defined frequency range.

18. The method of claim 12, wherein generating the control signal comprises setting a default capacitance of a variable capacitor upon start up to achieve substantially a minimum power for generating the oscillating signal.

19. The method of claim 12, wherein generating the control signal comprises generating the control signal so that the oscillating signal cycles with a defined frequency.

20. The method of claim 12, wherein generating the control signal comprises generating the control signal so that the oscillating signal cycles with a defined frequency in response to changes in temperature or aging of one or more components.

21. The method of claim 12, wherein supplying power comprises:
   low pass filtering the oscillating signal to generate the low pass filtered voltage; and
   producing a current for generating the oscillating signal based on the low pass filtered voltage.

22. The method of claim 12, wherein the sub-word consists of only one or more most significant bits of the digital word.

23. An apparatus for generating an oscillating signal, comprising:
   means for generating the oscillating signal;
   means for controlling a characteristic of the oscillating signal, wherein the controlling means comprises a digital word; and
   means for supplying power to the oscillating signal generating means in a manner that the supplied power varies inversely with a low pass filtered voltage based on an amplitude of the oscillating signal, wherein the power supplied to the oscillating signal generating means is based on a sub-word consisting only of a portion of the digital word.

24. The apparatus of claim 23, wherein the characteristic of the oscillating signal comprises a frequency or the amplitude of the oscillating signal.

25. The apparatus of claim 23, further comprising means for detecting the presence of the oscillating signal.

26. The apparatus of claim 23, further comprising means for amplifying the oscillating signal.

27. The apparatus of claim 23, wherein the power supplying means is adapted to supply a substantially minimum power for a given amplitude of the oscillating signal.

28. The apparatus of claim 23, wherein the controlling means is adapted to control the characteristic of the oscillating signal such that the power supplying means supplies substantially a minimum power for generating the oscillating signal cycling within a defined frequency range.

29. The apparatus of claim 23, wherein the controlling means is adapted to set a variable capacitance means of the oscillating signal generating means upon start up to achieve substantially a minimum power for generating the oscillating signal.

30. The apparatus of claim 23, wherein the controlling means is adapted to cause the oscillating signal generating means to generate the oscillating signal cycling with a defined frequency.

31. The apparatus of claim 23, wherein the controlling means is adapted to cause the oscillating signal generating means to generate the oscillating signal cycling with a defined frequency in response to changes in temperature or aging of the oscillating signal generating means.

32. The apparatus of claim 23, wherein the power supplying means comprises:
   means for low pass filtering the oscillating signal to generate the low pass filtered voltage; and
   means for generating a current for the oscillating signal generating means based on the low pass filtered voltage.

33. The apparatus of claim 23, wherein the sub-word consists of only one or more most significant bits of the digital word.

34. A computer program product for generating an oscillating signal, comprising:
   a computer storage medium comprising instructions executable to:
   generate the oscillating signal;
   generate a control signal for controlling a characteristic of the oscillating signal, wherein the control signal comprises a digital word; and
   supply power for generating the oscillating signal in a manner that the supplied power varies inversely with a low pass filtered voltage based on an amplitude of the oscillating signal, wherein the supplied power is based on a sub-word consisting only of a portion of the digital word.

35. A headset, comprising:
   an oscillator adapted to generate an oscillating signal;
   a controller adapted to generate a control signal that controls a characteristic of the oscillating signal, wherein the control signal comprises a digital word;
   a power supply adapted to supply power to the oscillator in a manner that the supplied power varies inversely with a low pass filtered voltage based on an amplitude of the oscillating signal, wherein the power supplied to the oscillator is based on a sub-word consisting only of a portion of the digital word;
   a transducer adapted to generate audio data; and
   a transmitter adapted to transmit audio data using the oscillating signal.

36. A watch, comprising:
   an oscillator adapted to generate the oscillating signal;
   a controller adapted to generate a control signal that controls a characteristic of the oscillating signal, wherein the control signal comprises a digital word;
   a power supply adapted to supply power to the oscillator in a manner that the supplied power varies inversely with a low pass filtered voltage based on an amplitude of the oscillating signal, wherein the power supplied to the oscillator is based on a sub-word consisting only of a portion of the digital word;
   a receiver adapted to receive data using the oscillating signal; and
   a user interface adapted to generate an indication based on the received data.

37. A sensing device, comprising:
an oscillator adapted to generate the oscillating signal;
a controller adapted to generate a control signal that controls a characteristic of the oscillating signal, wherein the control signal comprises a digital word;
a power supply adapted to supply power to the oscillator in a manner that the supplied power varies inversely with a low pass filtered voltage based on an amplitude of the oscillating signal, wherein the power supplied to the oscillator is based on a sub-word consisting only of a portion of the digital word;
a sensor adapted to generate sensed data; and
a transmitter adapted to transmit sensed data using the oscillating signal.

* * * * *